(12) United States Patent
Lee et al.

(10) Patent No.: US 7,974,819 B2
(45) Date of Patent: Jul. 5, 2011

(54) METHODS AND SYSTEMS FOR INTENSITY MODELING INCLUDING POLARIZATION

(75) Inventors: Chung-Yi Lee, Boise, ID (US); Fei Wang, Boise, ID (US)

(73) Assignee: Aptina Imaging Corporation, George Town, Grand Cayman (KY)

( * ) Notice: Subject to any disclaimer, the term of this patent is extended or adjusted under 35 U.S.C. 154(b) by 331 days.

(21) Appl. No.: 12/120,052

(22) Filed: May 13, 2008

(65) Prior Publication Data
US 2009/0287461 A1 Nov. 19, 2009

(51) Int. Cl.
*G06F 17/10* (2006.01)
*G06F 17/11* (2006.01)
*G06F 17/16* (2006.01)
*G06F 7/60* (2006.01)
*G06F 17/50* (2006.01)

(52) U.S. Cl. .................................. 703/2; 716/19; 355/67
(58) Field of Classification Search .................... 716/19; 703/2; 355/67
See application file for complete search history.

(56) References Cited

U.S. PATENT DOCUMENTS

| | | | |
|---|---|---|---|
| 7,079,223 B2 * | 7/2006 | Rosenbluth et al. ............ 355/67 |
| 7,617,477 B2 * | 11/2009 | Ye et al. ........................... 716/21 |
| 2005/0114823 A1 | 5/2005 | Kuchler et al. .................. 716/21 |
| 2005/0149902 A1 | 7/2005 | Shi et al. .......................... 716/21 |
| 2005/0240895 A1 | 10/2005 | Smith et al. ...................... 716/19 |
| 2005/0273753 A1 | 12/2005 | Sezginer ......................... 716/21 |
| 2005/0283747 A1 | 12/2005 | Adam ............................... 716/4 |
| 2006/0126046 A1 | 6/2006 | Hansen ........................... 355/55 |
| 2006/0248497 A1 | 11/2006 | Huang et al. .................... 716/21 |
| 2007/0031745 A1 | 2/2007 | Ye et al. .......................... 430/30 |
| 2007/0032896 A1 | 2/2007 | Ye et al. ........................ 700/108 |
| 2007/0209029 A1 | 9/2007 | Ivonin et al. .................... 716/19 |
| 2007/0218176 A1 | 9/2007 | Adam ........................... 426/489 |
| 2007/0224526 A1 | 9/2007 | Brunner et al. ................. 430/30 |
| 2007/0277145 A1 | 11/2007 | Scaman .......................... 716/19 |
| 2007/0291244 A1 | 12/2007 | Chang et al. .................... 355/67 |
| 2008/0032207 A1 | 2/2008 | Graeupner ........................ 430/5 |
| 2009/0070730 A1 * | 3/2009 | Zhang et al. .................... 716/19 |

FOREIGN PATENT DOCUMENTS

| | | |
|---|---|---|
| CN | 101013271 | 8/2007 |
| TW | 277828 B | 4/2007 |
| WO | WO 2007/018464 | 2/2007 |

OTHER PUBLICATIONS

Gennari, Frank. "Optical Proximity Correction (OPC)", Jan. 28, 2004, 3 pages. Accessable at http://www.cs.berkeley.edu/~ejr/GSI/cs267-s04/homework-0/results/gennari/.*

(Continued)

*Primary Examiner* — Kamini S Shah
*Assistant Examiner* — Suzanne Lo
(74) *Attorney, Agent, or Firm* — Kramer Levin Naftalis & Frankel LLP (57) ABSTRACT

Embodiments of the present invention provide computer readable media encoded with executable instructions for modeling an intensity profile at a surface illuminated by an illumination source through a mask. Further embodiments provide methods for correcting a mask pattern and methods for selecting an illumination source. Still further embodiments provide masks and integrated circuits produced using a model of the illumination source. Embodiments of the present invention take into account the polarization of the illumination source and are able to model the effect of polarization on the resultant intensity profile.

21 Claims, 7 Drawing Sheets

OTHER PUBLICATIONS

Ma et al. "Generalized inverse lithography methods for phase-shifting mask design", Optics Express, Nov. 12, 2007, vol. 15, No. 23, pp. 15066-15079.*

Poonawala, Amyn. "Mask design for signle and double exposure optical microlithography: an inverse imaging approach", Ph.D. thesis, University of California, Santa Cruz, 2007, 190 pages.*

"Scalar Diffraction Theory" Power Point Presentation, accessed Feb. 8, 2008, pp. 1-12.*

Flagello et al. *"Theory of High-NA Imaging in Homogeneous Thin Films"*, J. Opt. Soc. Am A, vol. 13, No. 1, Jan. 1996, pp. 53-64.

Hua Song et al. *"Modeling Polarized Illumination for OPC/RET"*, Photomask Technology, 2007, Proc. of SPIE, vol. 6730, 673057(2007), pp. 1-10.

Qiaolin Zhang et al. *"Polarization Aberration Modeling via Jones Matrix in the Context of OPC"*, Photomask Technology 2007, Proc. of SPIE vol. 6730, pp. 1-11.

Qiaolin Zhang et al. *"Novel Apodization and Pellicle Optical Models for Accurate Optical Proximity Correction Modeling at 45 and 32 nm"*, MEMS MOEMS, Jul.-Sep. 2007, vol. 6(3), pp. 1-11.

Franklin M. Schellenberg *"A History of Resolution Enhancement Technology"*, Optical Review, vol. 12, No. 2, 2005, pp. 83-89.

Jongwook Kye et al., *"Polarization Aberration Analysis in Optical Lithography Systems,"* Optical Microlithography XIX, Proc. of SPIE vol. 6154, Mar. 15, 2006, pp. 1-11.

*"Scalar Diffraction Theory"* Power Point Presentation, accessed Feb. 8, 2008, publication date unknown, pp. 1-12.

* cited by examiner

METHODS AND SYSTEMS FOR INTENSITY MODELING INCLUDING POLARIZATION

TECHNICAL FIELD

This invention relates to intensity profile modeling and illumination systems for photolithography.

BACKGROUND OF THE INVENTION

Figure 1:
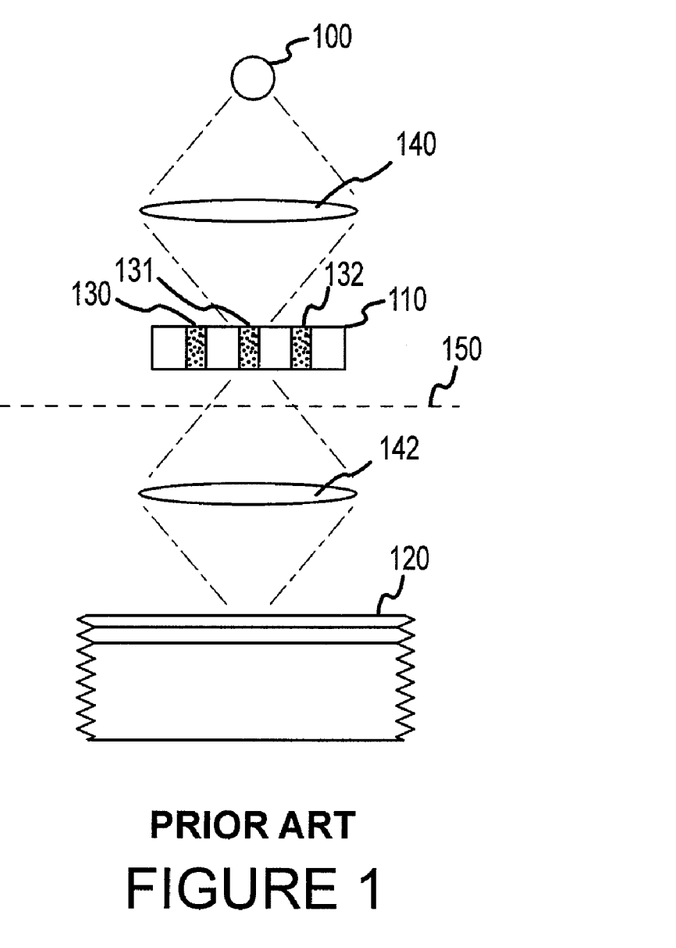
FIG. 1 is a schematic diagram of a lithography system in accordance as known in the art.

A general schematic diagram of a photolithography system is shown in FIG. 1. Energy from an illumination source 100 is passed through a mask 110 and focused onto a photo-sensitive surface 120. The mask contains patterned regions, such as regions 130, 131, 132. The goal of the photolithography system is generally to reproduce the pattern on the mask 110 on the photo-sensitive surface 120. One or more optical components—such as lenses 140 and 142—may be used to focus and otherwise manipulate the energy from the illumination source 100 through the mask 110 and onto the surface 120. The resulting image on the photo-sensitive surface allows the surface 120, and ultimately underlying layers, to be patterned. Photolithography is widely used in typical semiconductor processing facilities to create intricate features on various layers forming integrated circuits or other micromachined structures.

As the feature sizes desired for reproduction on the photo-sensitive surface shrink, it is increasingly challenging to accurately reproduce a desired pattern on the surface. Numerous optical challenges are presented, including those posed by diffraction and other optical effects or process variations as light is passed from an illumination source, through a system of lenses and the mask to finally illuminate the surface.

Optical proximity correction tools, such as Progen marketed by Synopsys, are available to assist in developing mask patterns that will reflect optical non-idealities and better reproduce a desired feature on a desired surface. For example, "dog-ears" or "hammer head" shapes may be added to the end of linewidth patterns on the mask to ensure the line is reproduced on the surface completely, without shrinking at either end or rounding off relative to the desired form.

Figure 2:
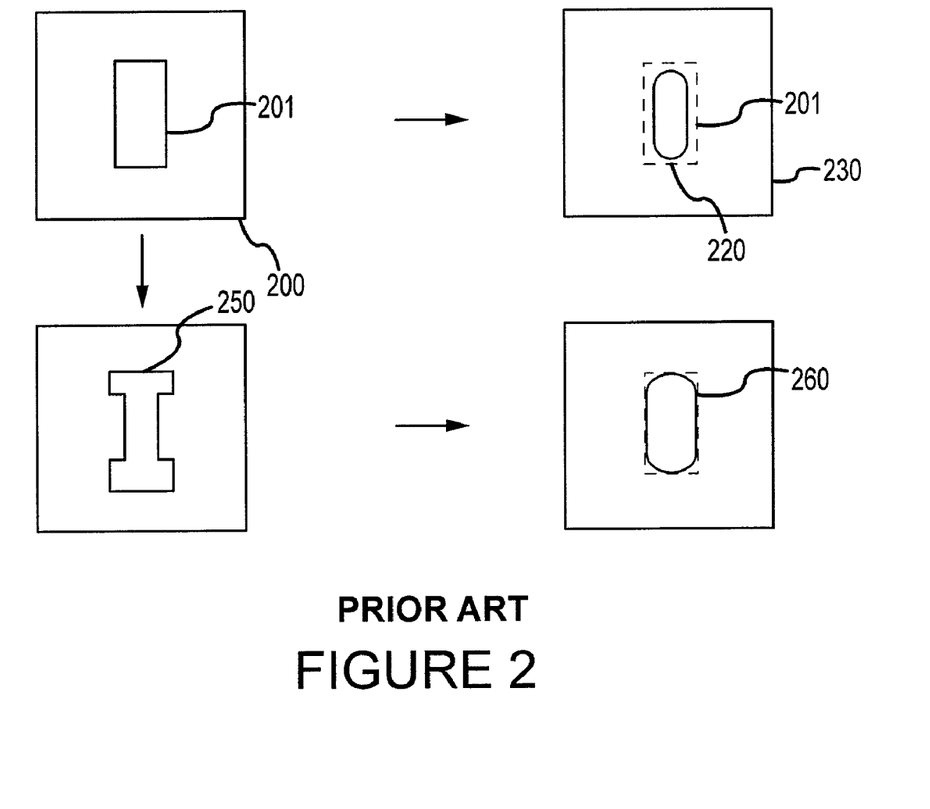
FIG. 2 is a schematic diagram of the operation of optical proximity correction as known in the art.

For example, FIG. 2 depicts an initial mask pattern 200 designed to reproduce rectangle 201. The actual feature reproduced on surface 230, after the lithography, may look something like feature 220, considerably shorter and rounder than the desired rectangle 201. An optical proximity correction system, however, could generate a modified mask pattern 250. The modified pattern 250 yields, after lithography, the feature 260, considerably closer to the initial desired feature 201.

Optical proximity correction tools, used to generate the modified mask pattern 250, for example, generate models of the intensity profile at the photo-sensitive surface after illumination of a mask with an illumination source. Intensity is typically represented by a scalar value. The intensity at a surface illuminated through a mask in a lithography system can be calculated generally by taking the convolution of a function representing the mask with a set of functions representing the lithography system that includes the illumination source. The set of functions representing the lithography system are eigenfunctions of a matrix operator.

Hopkins imaging theory provides the rigorous mathematical foundation for intensity calculations. The theory provides that intensity, in the spatial domain, is given by:

$$I(x,y) = \iiiint J(x_1-x_2, y_1-y_2) O^*(x_1,y_1) O^*(x_2,y_2) H(x-x_1, y-y_1) H^*(x-x_2, y-y_2) dx_1 dx_2 dy_1 dy_2$$

where x and y are coordinates in the spatial domain. O represents a mask pattern, H is a lens pupil function and J is a source pupil intensity function. A Fourier transform yields intensity in the frequency domain, given by:

$$I(x,y) = \iiiiint J(f,g) H(f+f_1, g+g_1) H^*(f+f_2, g+g_2) O^*(f_1,g_1) O^*(f_2,g_2) e^{-i2\pi[(f_1-f_2)x+(g_1-g_2)y]} df dg df_1 dg_1 df_2 dg_2$$

where f and g are coordinates in the frequency domain. As described further below, the frequency domain is also representative of the pupil plane in an illumination system.

This comprehensive theory provides for calculations of a complete intensity profile. To be useful, however, an optical proximity correction tool should generate an intensity profile within a reasonable amount of time to practically alter the mask design. Accordingly, the optical proximity correction tools make various simplifications and approximations of actual optical effects. In particular, optical proximity correction tools generally do not take into account polarization of an illumination source, or variation of that polarization across the illumination pupil.

Figure 3:
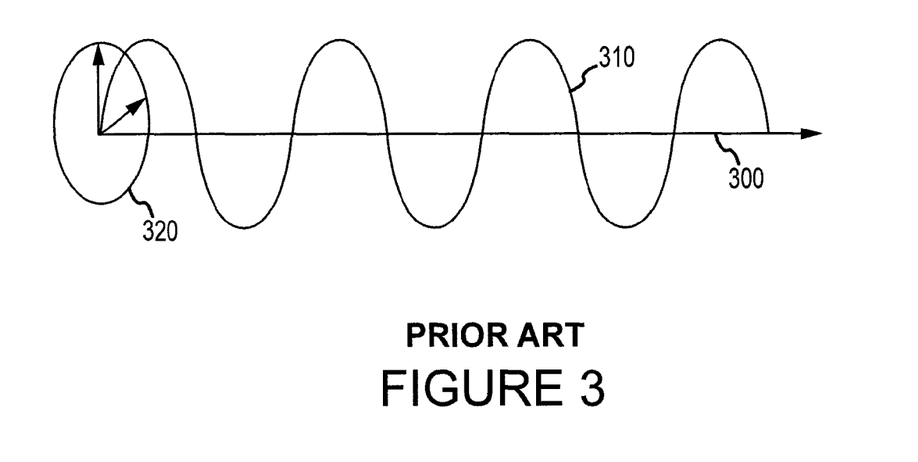
FIG. 3 is a schematic diagram showing a polarization of an electromagnetic wave as known in the art.

The polarization of an electromagnetic wave is generally the angle of oscillation. For example, in FIG. 3, wave 310 is shown propagating in direction 300. The oscillations, however, may occur at any angle perpendicular to the direction of propagation, shown by circle 320. The polarization angle of energy emitted by an illumination source may alter the diffraction effects experienced by the energy, and therefore ultimately, the pattern generated at the photo-sensitive surface.

DETAILED DESCRIPTION

Embodiments of the present invention take into account the polarization of an illumination source and are able to model the effect of polarization on the resultant intensity profile. Computationally, embodiments of the invention decompose a polarization pupil into a plurality of two-dimensional functions, also referred to as kernels. The plurality of two-dimensional functions are derived from Hopkins imaging theory. Methods of the present invention proceed by evaluating the plurality of two-dimensional functions at a plurality of points in a pupil plane of the illumination system to generate a polarization data model for the illumination source. This polarization data model is used to generate a matrix operator according to embodiments of the present invention, and the matrix operator is diagonalized to yield a set of eigenfunctions, which are convoluted with a function representative of the mask to generate the intensity profile. It will be clear to one skilled in the art that embodiments of the invention may be practiced without various details discussed below. In some instances, well-known optical and other lithography system components, controllers, control signals, and software operations have not been shown in detail in order to avoid unnecessarily obscuring the described embodiments of the invention.

Figure 4:
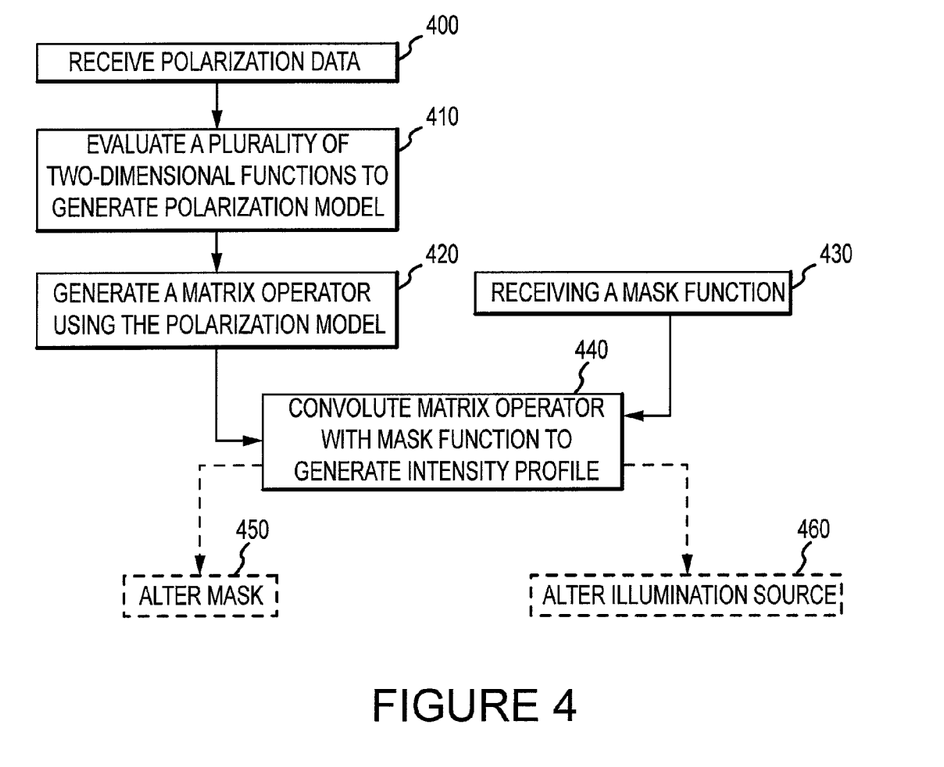
FIG. 4 is a flowchart of a method of generating intensity profile data according to an embodiment of the present invention.

An embodiment of a method and an embodiment of a set of instructions encoded on computer-readable media according to the present invention is shown in FIG. 4. Polarization data about the illumination source is received 400. The polarization data may include one or more analytical expressions describing polarization of the illumination source. This allows a designer to theoretically define a polarization of an illumination source. In some embodiments, the polarization data includes empirical data gathered by experimentally measuring an illumination source. This may allow for input of experimental polarization data gathered from an illumination source, in specific operating conditions in some embodiments. Any source of electromagnetic energy may be modeled according to embodiments of the present invention including conventional light sources, or ultraviolet laser sources.

A complete polarization pupil describing the illumination source is decomposed into a plurality of two-dimensional functions for the purposes of modeling the illumination source, including the effects of the source's polarization. The plurality of two-dimensional functions are evaluated 410 to generate a polarization model from the received polarization data. The polarization model may allow modeling of a resultant intensity profile in a reasonable amount of computational time.

In some embodiments of the present invention, the plurality of two-dimensional functions includes a first function describing polarization of the illumination source along a first axis, a second function describing polarization of the illumination source along a second axis, and a third and fourth function each describing a coupling component of the illumination source between the first and second axes. In some embodiments, the first and second axes are orthogonal axes. There are two coupling functions in some embodiments because a first coupling function describes a real portion of the coupling, and a second coupling function describes an imaginary portion of the coupling. In some embodiments, a fifth two-dimensional function describes a non-polarization component of the illumination source.

The plurality of two-dimensional functions are evaluated in a pupil plane of the illumination system in some embodiments of the present invention. Referring back to the diagram of an illumination system in FIG. 1, the pupil plane 150 is a location within the system where an image of the Fourier transform of the mask 110 is generated. At the pupil plane 150, the image can be described and modeled in the frequency domain in some embodiments.

Accordingly, in some embodiments, the five two-dimensional functions used to decompose a complete polarization pupil can be given as:

$K\_XX = \cos^2\alpha(f,g) * DoP(f,g);$ $K\_YY = \sin^2\alpha(f,g) * DoP(f,g);$ $K\_\cos\_XY = \sin\alpha(f,g) * \cos\alpha(f,g) * \cos\phi(f,g) * DoP(f,g);$ $K\_\sin\_XY = \sin\alpha(f,g) * \cos\alpha(f,g) * \sin\phi(f,g) * DoP(f,g);$ and $K\_non\_pol = 1 - DoP(f,g);$ where f and g represent pupil variables in frequency domain, such that coordinates in the pupil plane are defined by an f value and a g value, $\alpha(f,g)$ represents a polarization angle as a first function in the pupil plane; $\phi(f,g)$ represents a phase angle between a first and a second dimension polarization as a second function in the pupil plane, and $DoP(f,g)$ represents a degree of polarization as a third function in the pupil plane.

The derivation of these functions is now described. The theory provided below is provided to enable those skilled in the art to understand the origin of the five two-dimensional equations used in the embodiment described above and is not intended to limit embodiments of the invention to those five equations or to derivation in this manner.

Recall Hopkins equation for intensity, expressed in vector form:

$$I(x, y) = \int\int\int\int\int\int J(f \cdot g) H(f+f_1, g+g_1) H^*(f+f_2, g+g_2)$$

$$\sum_{\substack{i=x,y \\ j=x,y \\ k=x,y,z}} M_{ik}(f+f_1, g+g_1) M_{jk}^*(f+f_2, g+g_2) E_i E_j^* O(f_1, g_1)$$

$$O^*(f_2, g_2) e^{-i2\pi[(f-f_2)x+(g_1-g_2)y]} df\, dg\, df_1\, dg_1\, df_2\, dg_2$$

The summation in Hopkins equation above is expressing the electric field squared, where M is the matrix mapping the electric field from an object to an image. The summation can then be expressed as:

$\|E\|^2 = E_0(f,g) M^T(f_1,g_1) M^*(f_2,g_2) E_0^*(f,g)$

Now, polarization degree, angle ($\alpha$) and phase shift ($\phi$) can be represented in a vector function $E_0(f,g)$ given as:

$E_0 = E(f,g) * (\cos(\alpha(f,g)), \sin(\alpha(f,g)) e^{i\phi(f,g)})$ where $E(f,g)$ is the square root of the degree of polarization.

Assuming a simple case, where the degree of polarization=1 and $\phi=0$, we can write $E_0 = (\cos(\alpha(f,g)), \sin(\alpha(f,g)))$; and define functions $K\_sxx = \cos^2\alpha(f,g)$; $K\_syy = \sin^2\alpha(f,g)$ and $K\_sxy = \sin\alpha(f,g) * \cos\alpha(f,g)$ Expanding the $\|E\|^2$ equation above for this case, we have:

$$\|E\|^2 = \sum_{k=x,y,z} M_{xk}(f+f_1, g+g_1) M_{xk}^*(f+f_2, g+g_2) K\_sxx(f, g) +$$

$$\sum_{k=x,y,z} M_{yk}(f+f_1, g+g_1) M_{yk}^*(f+f_2, g+g_2) K\_syy(f, g) +$$

$$\sum_{k=x,y,z} (M_{xk}(f+f_1, g+g_1) M_{yk}^*(f+f_2, g+g_2) +$$

$$M_{yk}(f+f_1, g+g_1) M_{xk}^*(f+f_2, g+g_2)) K\_sxy(f, g)$$

An identity is used to put the cross term in a bilinear form. The identity is given as:

$$M_{xk}(f+f_1,g+g_1)M^*_{yk}(f+f_2,g+g_2)+M_{yk}(f+f_1,g+g_1)M^*_{xk}(f+f_2,g+g_2)=$$
$$\frac{1}{2}\left[\begin{array}{c}(M_{xk}(f+f_1,g+g_1)+M_{yk}(f+f_1,g+g_1))(M^*_{xk}(f+f_2,g+g_2)+M^*_{yk}(f+f_2,g+g_2))\\-(M_{xk}(f+f_1,g+g_1)-M_{yk}(f+f_1,g+g_1))(M^*_{xk}(f+f_2,g+g_2)-M^*_{yk}(f+f_2,g+g_2))\end{array}\right]$$

Using this identity, and the $\|E\|^2$ expression above, Hopkins equation becomes:

$$I(x,y)=$$
$$\iiint\iiint J(f,g)H(f+f_1,g+g_1)H^*(f+f_2,g+g_2)\sum_{k=x,y,z}M_{xk}(f+f_1,g+g_1)M^*_{xk}(f+f_2,g+g_2)K\_sxx$$
$$(f,g)+\sum_{k=x,y,z}M_{yk}(f+f_1,g+g_1)M^*_{yk}(f+f_2,g+g_2)K\_syy(f,g)+$$
$$\sum_{k=x,y,z}2\left[\begin{array}{c}0.5(M_{xk}(f+f_1,g+g_1)+M_{yk}(f+f_1,g+g_1))0.5(M^*_{xk}(f+f_2,g+g_2)+M^*_{yk}(f+f_2,g+g_2))\\-0.5(M_{xk}(f+f_1,g+g_1)-M_{yk}(f+f_1,g+g_1))0.5(M^*_{xk}(f+f_2,g+g_2)-M^*_{yk}(f+f_2,g+g_2))\end{array}\right]$$
$$K\_sxy(f,g)O(f_1,g_1)O^*(f_2,g_2)e^{-i2[(f_1-f_2)x+(g_1-g_2)y]}dfdgdf_1dg_1df_2dg_2$$

Writing this in the space domain, Hopkins equation takes the form:

$$I(x,y)=\iiiint\left[\left(cvr(J@K\_sxx)\sum_{k=x,y,z}bln(H@M_{xk})\right)+\right.$$
$$\left(cvr(J@K\_syy)\sum_{k=x,y,z}bln(H@M_{yk})\right)+$$
$$\left(2*cvr(J@K\_sxy)\sum_{k=x,y,z}[bln(0.5(H@M_{xk}+H@M_{yk}))-\right.$$
$$\left.\left.bln(0.5(H@M_{xk}-H@M_{yk}))]\right)\right]$$
$$O(x+x_1,y+y_1)O^*(x+x_2,y+y_2)dx_1dy_1dx_2dy_2$$

bln is a bilinear operation function, cvr is a covariant function and @ represents a convolution operation.

The first summation term, summing $bln(H@M_{xk})$ is represented as a pupil function, KpupilX, in optical proximity correction systems. The second summation term, summing $bln(H@M_{xy})$ is represented as a second pupil function, KpupilY and the third by a third function Kpcross. These functions are used to generate a matrix operator given as:

Koptics=norm(cvr(Ksource@K_sxx)*KpupilX+cvr(Ksource@K_syy)*KpupilY+2*cvr(Ksource@K_sxy)*Kpcross where norm is a normalization, cvr is a covariant operation, @ is a convolution operation and * is a multiplication.

Recall that this solution is for a simple case. For an arbitrary polarization angle and phase shift, Hopkins equation in the space domain takes the form:

$$I(x,y)=\iiiint\left[\left(cvr(J@K\_sxx)\sum_{k=x,y,z}bln(H@M_{xk})\right)+\right.$$

-continued $$\left(cvr(J@K\_syy)\sum_{k=x,y,z}bln(H@M_{yk})\right)+$$
$$\left(2*cvr(J@K\_sxy)\sum_{k=x,y,z}[bln(0.5(H@M_{xk}+H@M_{yk}))-\right.$$
$$\left.\left.bln(0.5(H@M_{xk}-H@M_{yk}))]\right)\right]$$
$$O(x+x_1,y+y_1)O^*(x+x_2,y+y_2)dx_1dy_1dx_2dy_2$$

where K cos_xy=cos α(f,g) sin α(f,g)cos φ(f,g)

K sin_xy=cos α(f,g)sin α(f,g)sin φ(f,g) and K_i=i (a constant function of 90 degree phase shift)

The first three summation terms, as before, represent KpupilX, KpupilY, and Kpcross, however, for this more generic case, there is a fourth summation term, which can be called Kpcross_i.

For a general polarization filter, therefore, in some embodiments five two-dimensional functions are used to generate a polarization model and, ultimately, to generate a matrix operator. These five functions, derived above are:

$K\_XX=\cos^2\alpha(f,g)*DoP(f,g)$;

$K\_YY=\sin^2\alpha(f,g)*DoP(f,g)$;

$K\_\cos\_XY=\sin\alpha(f,g)*\cos\alpha(f,g)*\cos\theta(f,g)*DoP(f,g)$;

$K\_\sin\_XY=\sin\alpha(f,g)*\cos\alpha(f,g)*\sin\theta(f,g)*DoP(f,g)$; and $K\_non\_pol=1-DoP(f,g)$;

Referring back to FIG. 4, a matrix operator is generated 420 using the polarization model. The matrix operator in embodiments of the present invention is generated using the above five functions and can be expressed as:

$$K\text{optics} = \text{norm}(cvr(J@K\_XX) * K\text{pupil}X + cvr(J@K\_YY) * K\text{pupil}Y + 2*cvr(J@K\_\cos\_XY) * K\text{pcross} + 2*cvr(J@K\_\sin\_XY) * K\text{pcross}\_i + cvr0.5 * (J@K\_\text{non}\_pol) * K\text{pupil}X + 0.5 * cvr(J@K\_\text{non}\_pol) * K\text{pupil}Y);$$

where norm includes a normalization operation; cvr includes a covariant operation; J represents a first pupil function, KpupilX and KpupilY represent second and third pupil functions in a first and second dimension, respectively, Kpcross and Kpcross_i represent third and fourth pupil functions capturing a real and an imaginary coupling between dimensions, respectively, and (includes a convolution operation.

This matrix operator can be generated in a reasonable amount of time using available computational systems in embodiments of the invention, and takes polarization of an illumination source into account.

Referring again to FIG. 4, a mask function is received 430 describing the mask, such as mask 110 in FIG. 1. The mask generally contains a pattern of at least partially opaque and at least partially transparent features such that energy passed through the mask is filtered by the mask. In some embodiments, the mask includes opaque features patterned on a transparent substrate, such as glass. Substantially any mask may be used in embodiments of the present invention, manufactured in any way known or developed in the art of mask fabrication. In some embodiments, the structure and materials used to form the mask are determined by the needs of the illumination system and the illumination source chosen.

The mask function is convoluted 440 with eigenfunctions of the matrix operator to generate a scalar intensity profile. This scalar intensity profile represents intensity at a surface, such as the surface 120 in FIG. 1. An image may be created on substantially any surface according to embodiments of the present invention, including a photoresist layer or other photo-sensitive surface.

Based on the intensity profile data generated 440, the mask function or the illumination source may be altered 450, 460 relative to those used to conduct the simulation in embodiments of the invention to achieve improved reproduction of a desired pattern on the surface. In some embodiments, the mask function is changed based on the intensity profile and a new mask is generated corresponding to the revised mask function.

Figure 5:
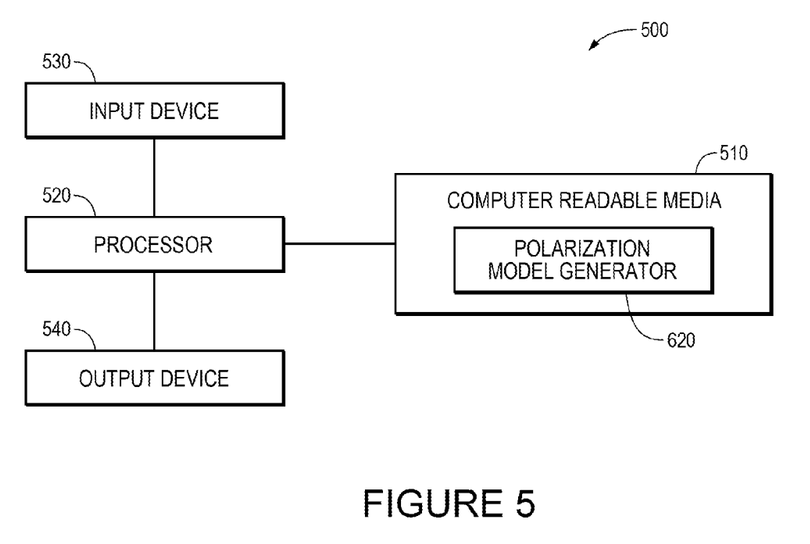
FIG. 5 is a schematic diagram of a system according to an embodiment of the present invention.

A system 500 according to an embodiment of the invention is shown schematically in FIG. 5. A computer readable media 510 stores instructions that when executed, cause processor 520 to perform any or all of the acts described, for example, in FIG. 4 according to embodiments of the present invention. The computer readable media 510 may be coupled to the processor 520 using any known communication means, wired or wireless. The computer readable media may include one or more memory devices, CDs, DVDs, Flash drives, disk drives or the like in embodiments of the invention. One or more input devices such as input device 530 can be connected to the processor 520 to provide inputs, such as mask data or polarization data as described with reference to FIG. 4. The input device 530 may include, for example, a keyboard or one or more other memories, CDs, DVDs, Flash drives, disk drives or communication devices. In some embodiments, the input device 530 may be the same as, or include the computer readable media 510. It is to be understood that any intensity profile data, polarization data, mask function data, and functions and equations described herein can be encoded as data or instructions on one or more computer readable media, and transmitted using one or more transmission mediums. One or more output devices, such as output device 540, may be in communication with the processor 520 to receive data from the processor, such as intensity profile data. The output devices may include, for example, a display to display the intensity profile data or another memory to store the intensity data. In some embodiments, a display provides a graphical or numerical display of the intensity profile data. In other embodiments, the intensity profile data is stored in a physical memory. In other embodiments, the intensity profile data may not be specifically output but may be used by the processor to create other or different data, such as a mask or illumination source alteration.

Figure 6:
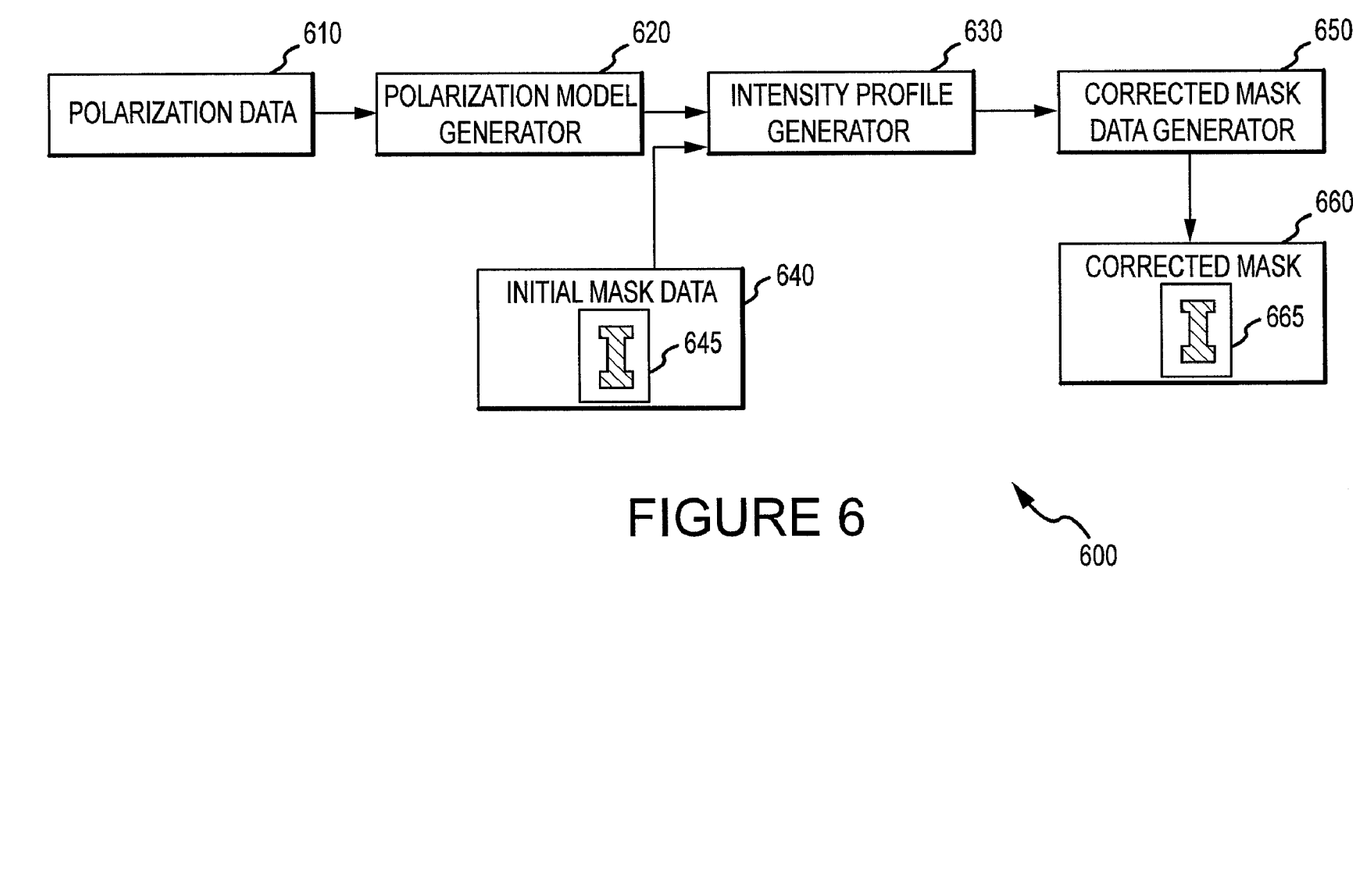
FIG. 6 is a schematic diagram of a corrected mask generator according to an embodiment of the present invention.

Some embodiments of the present invention provide methods and systems for correcting a mask pattern. An embodiment of a mask correcting system 600 is shown in FIG. 6. As described above with reference to FIGS. 4 and 5, polarization data 610, which may represent data stored on a storage media or transmitted over a communication medium, is received by polarization model generator 620. The polarization model generator evaluates a plurality of two-dimensional functions at a plurality of points in the pupil plane, as described above, to generate a polarization model of an illumination source. The polarization model is provided to an intensity profile generator 630 that receives data 640 encoding an initial mask pattern, such as feature 645. The resultant intensity profile data is provided to a corrected mask data generator 650. The mask pattern may be corrected through any known methodologies for altering mask features to improve the reproduction of a desired feature. The intensity profile data provided to the corrected mask data generator 650, however, includes effects from polarization of the illumination source in accordance with embodiments of the present invention. In some embodiments, as understood in the art, features are added to the initial mask pattern to form the corrected mask, and in other embodiments, features may be removed from the initial mask pattern. Generally, a corrected mask pattern is desired that more accurately reproduces a desired feature at the surface. That is, a comparison of desired features with the intensity profile is conducted and the mask pattern may be altered based on the comparison. The corrected mask data generator 650 generates corrected mask data describing corrected features, and a corrected mask 660 may be generated according to the corrected mask data, for example containing corrected feature 665. The polarization model generator, intensity profile generator, and corrected mask data generator may all be implemented in software, hardware, or combinations thereof. One or all of the components may be implemented using a processing device coupled to computer readable media encoding appropriate instructions, as generally illustrated in FIG. 5. Multiple components may be executed by the same processing system in some embodiments.

The masks produced by embodiments of the present invention may be used in lithography systems of generally any type. These lithography systems may be used in various semiconductor or other micromachining fabrication facilities to create various products including integrated circuit chips having features patterned using the mask. The masks and products made using embodiments of the present invention may have improved feature size or more accurate reproduction of features than those made without use of polarization data during the intensity modeling process. This may ultimately decrease failure rate of these final products or make smaller or more complicated feature arrangements possible.

Figure 7:
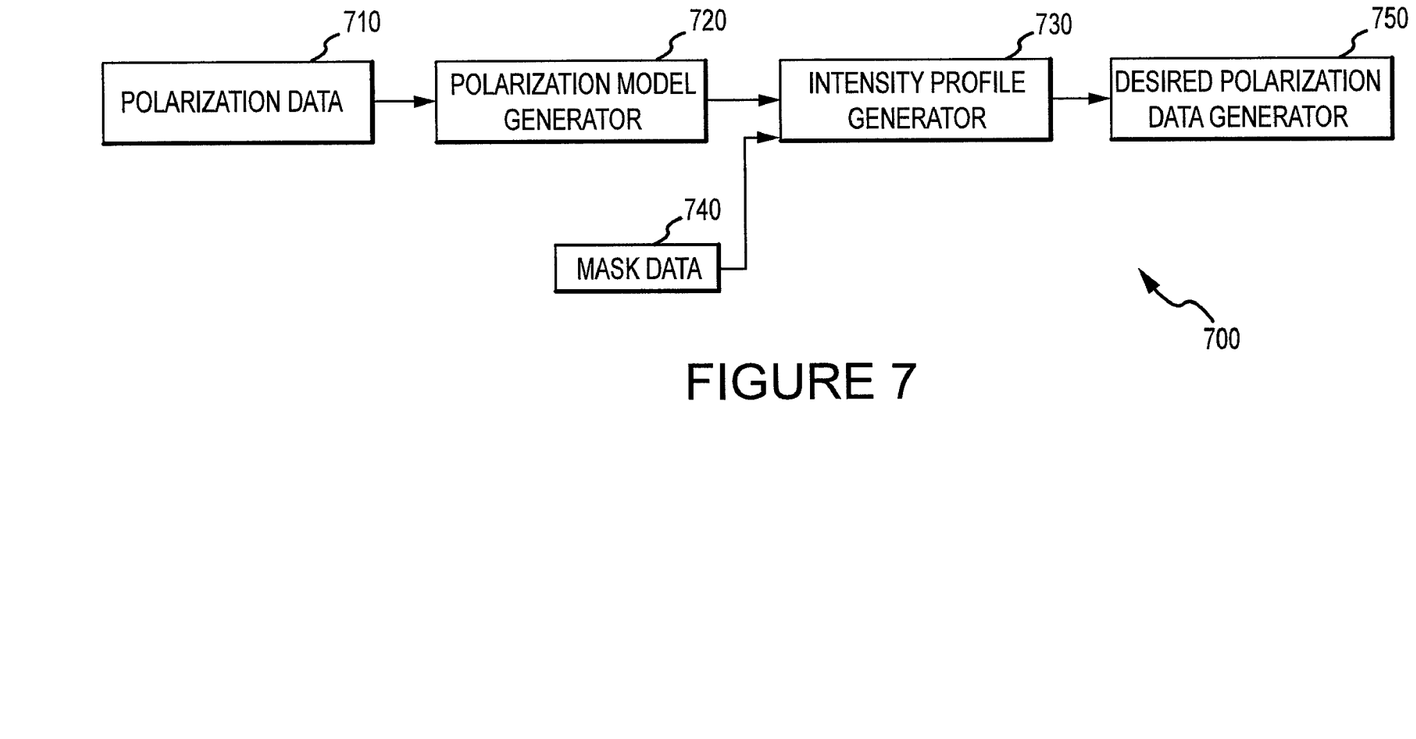
FIG. 7 is a schematic diagram of a desired polarization data generator according to an embodiment of the present invention.

Some embodiments of the present invention also provide systems and methods for selecting an illumination source for an illumination system. An embodiment of a system 700 for generating desired polarization data is shown in FIG. 7. As described above with reference to FIGS. 4, 5 and 6, polarization data 710 describing an initial illumination source is received. A polarization model generator 720 generates a polarization model by evaluating a plurality of two-dimensional functions at a plurality of locations within a pupil plane, and an intensity profile generator 730 receives the polarization data model and mask data 740 to generate an intensity profile. A desired polarization data generator 750 may then generate, based on a comparison of the intensity profile with desired features described by the mask data 740, desired polarization data describing a polarization that may better reproduce a feature on a mask at a surface. In this manner, a polarization of an illumination source may be selected to reproduce a feature. The polarization model generator, intensity profile generator, and desired polarization data generator may all be implemented in software, hardware, or combinations thereof. One or all of the components may be implemented using a processing device coupled to computer readable media encoding appropriate instructions, as generally illustrated in FIG. 5. Multiple components may be executed by the same processing system in some embodiments.

In some embodiments, both the mask and the polarization of the illumination source may be altered based on the modeled intensity profile data.

From the foregoing it will be appreciated that, although specific embodiments of the invention have been described herein for purposes of illustration, various modifications may be made without deviating from the spirit and scope of the invention. Embodiments of the present invention can be implemented in software, hardware, or combinations thereof. One or more general or special purpose computers may be programmed to carry out methods in accordance with embodiments of the present invention.

What is claimed is:

1. A non-transitory computer readable medium encoded with computer executable instructions for modeling an intensity profile at a surface resulting from illuminating a mask with an illumination system having an illumination source, including instructions that when executed perform the steps of:
  receiving polarization data describing the illumination source;
  generating a polarization data model of the illumination source using the polarization data by evaluating a plurality of two-dimensional functions at a plurality of points in a pupil plane associated with the illumination system, wherein the plurality of two-dimensional functions includes: a first function describing polarization of the illumination source along a first axis; a second function describing polarization of the illumination source along a second axis; a third and a fourth function each describing a coupling component of the illumination source between the first and second axes and based at least in part on a phase angle between the first and second axes; and a fifth function describing a non-polarization component based on a degree of polarization;
  generating a matrix operator using the polarization data model;
  generating a mask function based on the mask; and
  convoluting the matrix operator with the mask function to generate intensity profile data representing the intensity profile at the surface.

2. The computer readable medium of claim 1 further including instructions for altering the mask function based on the intensity profile.

3. The computer readable medium of claim 1 wherein the instructions for receiving polarization data include instructions for receiving data analytically describing the polarization of the illumination source.

4. The computer readable medium of claim 1 wherein the instructions for receiving polarization data include instructions for receiving data empirically describing the polarization of the illumination source.

5. The computer readable medium of claim 1 wherein the first and second axes are orthogonal.

6. The computer readable medium of claim 1 wherein the plurality of two-dimensional functions include:

$$K\_XX = \cos^2\alpha(f,g) * DoP(f,g);$$

$$K\_YY = \sin^2\alpha(f,g) * DoP(f,g);$$

$$K\_\cos\_XY = \sin\alpha(f,g) * \cos\alpha(f,g) * \cos\phi(f,g) * DoP(f,g);$$

$$K\_\sin\_XY = \sin\alpha(f,g) * \cos\alpha(f,g) * \sin\phi(f,g) * DoP(f,g);$$
and $$K\_non\_pol = 1 - DoP(f,g);$$

where f and g represent pupil variables in a spatial frequency domain, such that coordinates in the pupil plane are defined by an f value and a g value, $\alpha(f,g)$ represents a polarization angle as a first function in the pupil plane; $\phi(f,g)$ represents a phase angle between a first and a second dimension polarization as a second function in the pupil plane, and $DoP(f,g)$ represents a degree of polarization as a third function in the pupil plane.

7. The computer readable medium of claim 6 wherein the matrix operator is given by:

$$Koptics = \text{norm}(cvr(J@K\_XX)*KpupilX + cvr(J@K\_YY)*KpupilY + 2*cvr(J@K\_\cos\_XY)*Kpcross + 2*cvr(J@K\_\sin\_XY)*Kpcross\_i + cvr0.5*(J@K\_non\_pol)*KpupilX + 0.5*cvr(J@K\_non\_pol)*KpupilY);$$

where norm includes a normalization operation; cvr includes a covariant operation; J represents a first pupil function, KpupilX and KpupilY represent second and third pupil functions in a first and second dimension, respectively, Kpcross and Kpcross_i represent third and fourth pupil functions capturing a real and an imaginary coupling between dimensions, respectively, and @ includes a convolution operation.

8. A method of selecting at least one component of an illumination system including an illumination source for illuminating a surface through a mask, the method comprising:
  generating, using a processor, a polarization data model of the illumination source by evaluating a plurality of two-dimensional functions at a plurality of points in a pupil plane associated with the illumination system;
  modeling, using a processor, an intensity profile at the surface based in part on the polarization data model and a mask function; and
  altering, using a processor, at least one of the mask function and the illumination source based on the modeled intensity profile, wherein the plurality of two-dimensional functions include:

$$K\_XX = \cos^2\alpha(f,g) * DoP(f,g);$$

$$K\_YY = \sin^2\alpha(f,g) * DoP(f,g);$$

$$K\_\cos\_XY = \sin\alpha(f,g) * \cos\alpha(f,g) * \cos\phi(f,g) * DoP(f,g);$$

$K\_sin\_XY = \sin \alpha(f,g) * \cos \alpha(f,g) * \sin \phi(f,g) * DoP(f,g)$; and $K\_non\_pol = 1 - DoP(f,g)$;

where f and g represent pupil variables in a spatial frequency domain, such that coordinates in the pupil plane are defined by an f value and a g value, $\alpha(f,g)$ represents a polarization angle as a first function in the pupil plane; $\phi(f,g)$ represents a phase angle between a first and a second dimension polarization as a second function in the pupil plane, and $DoP(f,g)$ represents a degree of polarization as a third function in the pupil plane.

9. The method of claim 8 further comprising generating a mask corresponding to the altered mask function.

10. The method of claim 8 further comprising:
receiving polarization data describing the illumination source; and
wherein the act of generating a polarization data model uses the polarization data.

11. The method of claim 8 wherein the act of modeling the intensity profile further comprises:
generating a matrix operator using the polarization data model;
generating a mask function based on the mask; and
convoluting the operator with the mask function to generate a modeled intensity profile.

12. The method of claim 8 wherein the act of altering the mask function includes describing additional features on the mask.

13. The method of claim 8 wherein the act of altering the mask function includes removing description of portions of features from the mask.

14. The method of claim 8 wherein the plurality of two-dimensional functions includes a first function describing polarization of the illumination source along a first axis, a second function describing polarization of the illumination source along a second axis, and a third and a fourth function each describing a coupling component of the illumination source between the first and second axes.

15. A mask for use in an illumination system having an illumination source, to reproduce a predetermined feature at a surface, the mask comprising:
a pattern of at least partially opaque and at least partially transparent features, the pattern selected based on the predetermined feature and based on a modeled intensity profile at the surface generated by the illumination source, the modeled intensity determined by acts including:
receiving polarization data describing the illumination source;
receiving initial mask profile data based on the predetermined feature;
generating a polarization model of the illumination source by evaluating a plurality of two-dimensional functions at a plurality of points in a pupil plane associated with the illumination system, wherein the plurality of two-dimensional functions includes: a first function describing polarization of the illumination source along a first axis; a second function describing polarization of the illumination source along a second axis; a third and a fourth function each describing a coupling component of the illumination source between the first and second axes and based at least in part on a phase angle between the first and second axes; and a fifth function describing a non-polarization component based on a degree of polarization;
generating a matrix operator using the polarization model;
generating a mask function based on the initial mask profile data; and
convoluting the operator with the mask function to generate the intensity profile.

16. An integrated circuit having features constructed, at least in part, by illuminating a surface with an illumination system having an illumination source through a mask, the mask comprising:
a pattern of at least partially opaque and at least partially transparent features, the pattern selected based on the predetermined feature and based on a modeled intensity profile at the surface generated by the illumination source, the modeled intensity determined by acts including:
receiving polarization data describing the illumination source;
receiving initial mask profile data based on the predetermined feature;
generating a polarization model of the illumination source by evaluating a plurality of two-dimensional functions at a plurality of points in a pupil plane associated with the illumination system, wherein the plurality of two-dimensional functions includes: a first function describing polarization of the illumination source along a first axis; a second function describing polarization of the illumination source along a second axis; a third and a fourth function each describing a coupling component of the illumination source between the first and second axes and based at least in part on a phase angle between the first and second axes; and a fifth function describing a non-polarization component based on a degree of polarization;
generating a matrix operator using the polarization model;
generating a mask function based on the initial mask profile data; and
convoluting the operator with the mask function to generate the intensity profile.

17. A method of selecting an illumination source for an illumination system to produce at least one predetermined feature on a surface by illuminating a mask, the method comprising:
Receiving, using a processor, mask data;
modeling, using a processor, the intensity profile generated at the surface when the mask is illuminated using the illumination source, the act of modeling including:
receiving, using a processor, polarization data describing an initial illumination source;
generating, using a processor, a polarization model of the illumination source by evaluating a plurality of two-dimensional functions at a plurality of points in a pupil plane associated with the illumination system;
generating, using a processor, a matrix operator using the polarization model;
generating, using a processor, a mask function based on the mask data; and
convoluting, using a processor, the operator with the mask function to generate an intensity profile; and
selecting, using a processor, a desired polarization for the illumination source based on the intensity profile, wherein the plurality of two-dimensional functions include:

$K\_XX = \cos^2 \alpha(f,g) * DoP(f,g)$;

$K\_YY = \sin^2 \alpha(f,g) * DoP(f,g)$;

$K\_cos\_XY = \sin \alpha(f,g) * \cos \alpha(f,g) * \cos \phi(f,g) * DoP(f,g)$;

$K\_sin\_XY = \sin \alpha(f,g) * \cos \alpha(f,g) * \sin \phi(f,g) * DoP(f,g)$; and $K\_non\_pol = 1 - DoP(f,g)$;

where f and g represent pupil variables in a spatial frequency domain, such that coordinates in the pupil plane are defined by an f value and a g value, $\alpha(f,g)$ represents a polarization angle as a first function in the pupil plane; $\phi(f,g)$ represents a phase angle between a first and a second dimension polarization as a second function in the pupil plane, and DoP(f,g) represents a degree of polarization as a third function in the pupil plane.

18. The method of claim 17 wherein the plurality of two-dimensional functions includes a first function describing polarization of the illumination source along a first axis, a second function describing polarization of the illumination source along a second axis, and a third and a fourth function each describing a coupling component of the illumination source between the first and second axes.

19. The method of claim 18 wherein the first and second axes are orthogonal.

20. The method of claim 18 wherein the plurality of two-dimensional functions further includes a fifth function describing a non-polarization component.

21. The method of claim 17 wherein the matrix operator is given by:

$$Koptics = \mathrm{norm}(cvr(J@K\_XX)*KpupilX + cvr(J@K\_YY)*KpupilY + 2*cvr(J@K\_\cos\_XY)*Kpcross + 2*cvr(J@K\_\sin\_XY)*Kpcross\_i + cvr0.5*(J@K\_non\_pol)*KpupilX + 0.5*cvr(J@K\_non\_pol)*KpupilY);$$

where norm includes a normalization operation; cvr includes a covariant operation; J represents a first pupil function, KpupilX and KpupilY represent second and third pupil functions in a first and second dimension, respectively, Kpcross and Kpcross_i represent third and fourth pupil functions capturing a real and an imaginary coupling between dimensions, respectively, and @ includes a convolution operation.

* * * * *